United States Patent [19]

Otsubo

[11] Patent Number: 4,622,094

[45] Date of Patent: Nov. 11, 1986

[54] METHOD OF CONTROLLING DRY ETCHING BY APPLYING AN AC VOLTAGE TO THE WORKPIECE

[75] Inventor: Toru Otsubo, Fujisawa, Japan

[73] Assignee: Hitachi, Ltd., Tokyo, Japan

[21] Appl. No.: 680,838

[22] Filed: Dec. 12, 1984

[30] Foreign Application Priority Data

Dec. 14, 1983 [JP] Japan .................... 58-234319

[51] Int. Cl.⁴ ........................................ H01L 21/306
[52] U.S. Cl. .................................. 156/627; 156/643;
156/345; 204/192.32
[58] Field of Search ............... 156/643, 627, 345; 204/192 E

[56] References Cited

U.S. PATENT DOCUMENTS

| | | | |
|---|---|---|---|
| 4,222,838 | 9/1980 | Bhagat et al. | 204/192 E |
| 4,298,419 | 11/1981 | Suzuki et al. | 204/192 E |
| 4,316,791 | 2/1982 | Taillet | 156/643 |
| 4,333,816 | 6/1982 | Kuyel | 156/643 |
| 4,352,725 | 10/1982 | Tsukuda | 156/345 |
| 4,464,223 | 8/1984 | Gorin | 156/345 |
| 4,496,448 | 1/1985 | Tai et al. | 204/192 E |
| 4,585,516 | 4/1986 | Corn et al. | 204/298 |

FOREIGN PATENT DOCUMENTS

158929  3/1982  Japan ........................ 156/345
131374  8/1982  Japan .

*Primary Examiner*—Jerome Massie
*Attorney, Agent, or Firm*—Antonelli, Terry & Wands

[57] ABSTRACT

Dry etching is carried out in such a manner that a periodical potential is applied to an electrode having a workpiece thereon, the above potential changes substantially linearly at a first part of each period and has a reverse polarity at a second part of each period, the linear change of potential at the first part compensates for a change in surface potential of the workpiece to keep constant an ion accelerating voltage between a plasma and the surface of the workpiece, and the potential of the reverse polarity at the second part allows charged particle of the reverse polarity to impinge on the workpiece, thereby neutralizing the electric charge on the surface of the workpiece. Accordingly, the energy of ion incident on the workpiece is distributed in a narrow range around a desired value, and thus an etching rate and a selection ratio can be improved.

18 Claims, 13 Drawing Figures

METHOD OF CONTROLLING DRY ETCHING BY APPLYING AN AC VOLTAGE TO THE WORKPIECE

The present invention relates to dry etching techniques utilizing a plasma, and more particularly to dry etching techniques capable of controlling the acceleration energy of charged particles which are produced in the plasma.

Dry etching is one of the important processes, for example in semiconductor technology, and is very important to the fabrication of a large scale integration circuit and a magnetic bubble device which are both required to have a high packing density. The dry etching includes plasma etching, reactive ion etching, ion etching, and others. However, the plasma etching and the reactive ion etching are particularly important from the viewpoints of damage to workpiece, mass productivity, etching rate, selectivity, etc.

Generally speaking, in the dry etching, it is desirable to be able to form a fine pattern precisely in accordance with a mask without producing any side etching, to have a high etching rate, and to have excellent selectivity (that is, to make large a ratio of the etching rate for a workpiece to be etched to the etching rate for a mask film or an underlying layer). Various characteristics of dry etching are determined by parameters such as a gas pressure, and plasma exciting power (for example, high frequency power). In the case where a radio frequency discharge gas plasma is used, when the gas pressure is raised, the probability of collision between particles is increased, the kinetic energy of each charged particle is reduced, and the chemical, isotropic tendency of etching is strengthened. That is, although the underlying layer is not readily etched, it is hard to reduce the side etching, and thus the dimensional accuracy of the pattern formed by the etching is reduced. When the high frequency power is increased, the kinetic energy of a charged particle is increased, and the physical tendency (that is, sputtering tendency) of etching is strengthened. That is, although the etching rate is increased, there is a fear of the underlying layer being etched, and the selectivity is lowered. As has been explained in the above, the etching characteristics are related to each other. Therefore, it is difficult to control only a desired characteristic without producing any adverse effect on the remaining characteristics.

Some mechanisms for controlling the etching characteristics are proposed in Japanese Patent Kokai (Laid-open) Specifications Nos. 56-33839 and 57-131374. However, it is difficult to increase the etching rate for a to-be-etched layer and yet to keep low the etching rate for an underlying layer or a mask layer, by the above mechanisms.

An object of the present invention is to provide a dry etching method capable of increasing the etching rate for a film to be etched, without increasing the etching rate for an underlying film, and an apparatus for carrying out the above method.

In dry etching, the number of active ions and the ion energy are the most important factors for determining etching characteristics. The number of active ions is mainly concerned with the etching rate, and the ion energy is mainly concerned with the selectivity of etching. Accordingly, if the number of active ions and the ion energy and the ion energy distribution can be controlled independently of each other, it will be possible to control the etching rate and the selectivity separately.

The present inventor herein proposes to apply a substantially constant accelerating voltage between a plasma and the surface of a workpiece, to make narrow the distribution width of ion energy and to set the mean value of ion energy to a predetermined value, thereby controlling the selectivity of etching separately from the etching rate.

The present invention will become apparent from the following detailed description taken in conjunction with the accompanying drawings, in which.

In order to facilitate the understanding of the present invention, prior art will first be explained.

Figure 1A:
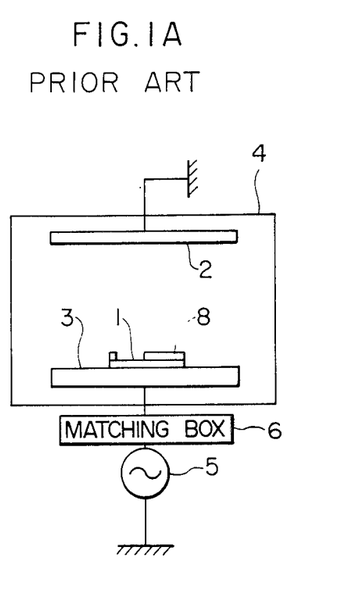
FIG. 1A is a schematic diagram showing an example of a conventional dry etching apparatus.

FIG. 1A shows an example of the conventional dry etching apparatus having parallel plate electrodes. Referring to FIG. 1A, an upper electrode 2 and a lower electrode 3 are disposed in a processing chamber 4. Further, the upper electrode 2 is grounded, and the lower electrode 3 is connected through an impedance matching box 6 to a high frequency power source 5 which generates a voltage having a frequency of, for example, 13.56 MHz. A workpiece, for example, a semiconductor substrate 1 is placed on the lower electrode 3. The processing chamber 4 is evacuated by an evacuating system (not shown) and an etching gas is introduced into the processing chamber 4 so that a pressure of 10 to 0.05 Torr (namely, about 1300 to 7 Pa) is maintained in the processing chamber 4. In this state, a high frequency voltage, that is, a radio frequency voltage (hereinafter simply referred to as "RF voltage") is applied to the lower electrode 3, to generate a gas plasma. The ion produced in the plasma is accelerated by an electric field which is formed between the plasma and the lower electrode 3, and then impinges on the substrate 1 perpendicularly thereto through apertures of a resist mask, to etch exposed portions of the substrate 1.

Figure 1B:
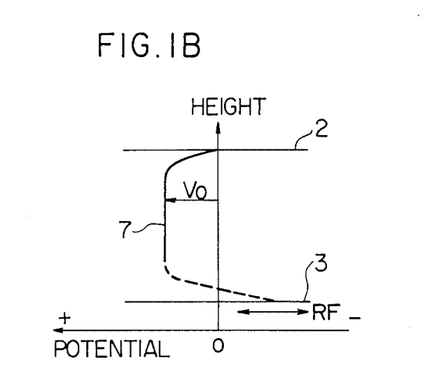
FIG. 1B is a diagram showing the potential distribution in the apparatus of FIG. 1A.
Figure 3:
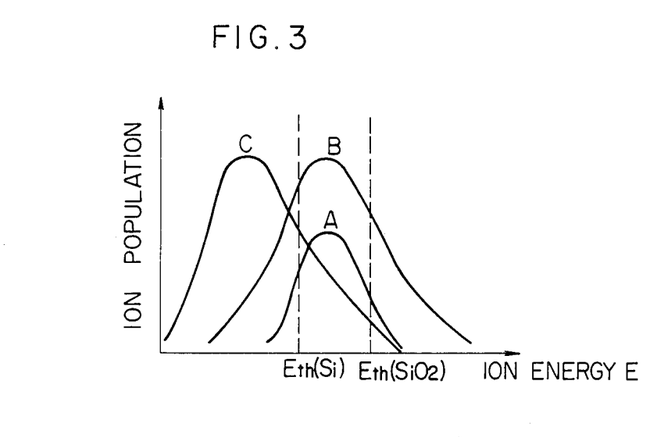
FIG. 3 is a distribution diagram showing relationships between the ion energy and the number of active ions in the apparatuses of FIGS. 1 and 2.

FIG. 1B schematically shows the potential distribution in the processing chamber 4. Since the upper electrode 2 is grounded as shown in FIG. 1A, the potential of the electrode 2 is kept at zero. The lower electrode 3 is applied with the RF voltage through a matching circuit which isolates the lower electrode from the ground potential in dc sense. Thus, the potential of the electrode 3 is afforded with a self-bias voltage in dc sense and swings therefrom in positive and negative directions according to the RF voltage. In general, electrons and positive ions coexist in the plasma. However, the electron has a very small mass, and therefore is apt to be driven out by an electric field. Accordingly, the plasma has a small positive potential (namely, a plasma potential $V_o$) and the lower electrode charged with electrons has a negative potential (self-biasing voltage). It may be noted that the potential value $V_o$ is exaggeratedly shown in FIG. 1B. Thus, the sum of the plasma potential $V_o$ and the self-bias voltage is applied between the plasma and the lower electrode 3 and RF voltage is superposed thereon. A positive ion which has left the plasma, is accelerated by the established field between the plasma and the electrode 3, in a direction toward the lower electrode 3. The energy of positive ion incident on the substrate 1 is distributed as shown in FIG. 3, on the basis of the above-mentioned accelerating voltage and the collision between particles. Incidentally, a positive ion existing in the vicinity of the upper electrode 2 is accelerated by the small potential difference $V_o$.

Now, let us consider the case where a poly-silicon layer on a silicon oxide layer is selectively dry-etched by a carbon tetrachloride $CCl_4$ gas in accordance with a resist mask on the poly-silicon layer, with reference to FIG. 3. Further, let us express the threshold ion energy required for etching silicon and the threshold ion energy required for etching silicon oxide by $E_{th}(Si)$ and $E_{th}(SiO_2)$, respectively, where $E_{th}(SiO_2)$ is greater than $E_{th}(Si)$. In order to etch the poly-silicon layer without etching the underlying silicon oxide layer, it is required to put the energy of ion incident upon the substrate 1 in a range from $E_{th}(Si)$ to $E_{th}(SiO_2)$.

Now, let us suppose that the positive ion incident on the substrate has such energy distribution as indicated by a curve B in FIG. 3. Then, the ion having energy greater than $E_{th}(SiO_2)$ etches the underlying silicon oxide layer. If the RF power supplied to the plasma is reduced to avoid the etching for the underlying silicon oxide layer, the positive ion incident on the substrate will have such energy distribution as indicated by a curve A in FIG. 3. That is, the number of ions having energy greater than $E_{th}(SiO_2)$ is decreased, and thus it is prevented to etch the underlying silicon oxide layer. However, the number of ions whose energy lies in a range between $E_{th}(Si)$ and $E_{th}(SiO_2)$, is also decreased, and thus the etching rate for the poly-silicon layer is reduced. On the other hand, if the pressure of etching gas is raised, the positive ion incident on the substrate will have such energy distribution as indicated by a curve C in FIG. 3. That is, the energy distribution curve B is shifted to the low energy side, and thus not only the etching rate for the underlying silicon oxide layer but also the etching rate for the poly-silicon layer is greatly reduced. Further, when the gas pressure is raised, the chemical, isotropic tendency of etching is strengthened, and thus the directionality of etching is reduced, which causes a decrease in pattern accuracy. As mentioned above, the simultaneous improvements in selectivity, etching rate and pattern accuracy have been difficult.

Figure 2A:
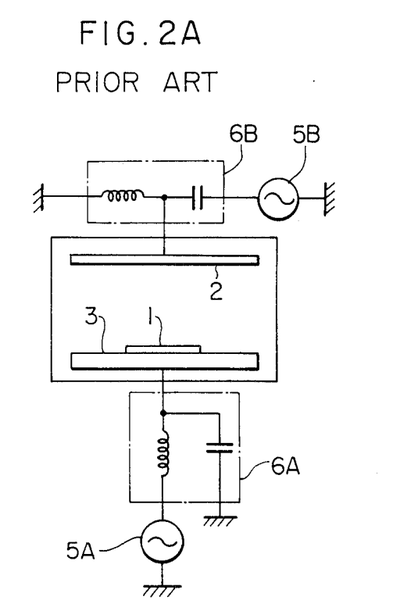
FIG. 2A is a schematic diagram showing another example of a conventional dry etching apparatus.
Figure 2B:
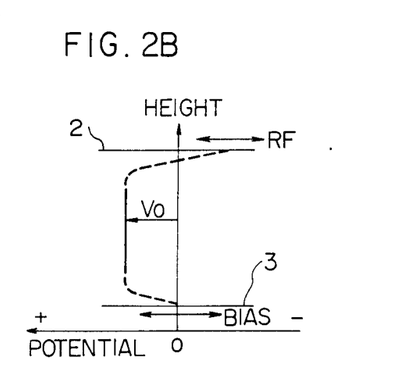
FIG. 2B is a diagram showing the potential distribution in the apparatus of FIG. 2A.

FIG. 2A shows an example of the conventional dry etching apparatus equipped with a mechanism for controlling ion energy independently of plasma density. Referring to FIG. 2A, the upper electrode 2 is connected to the ground potential through a filter circuit 6B, at low frequencies, and connected to a high frequency power source 5B at high frequencies. The lower electrode 3 is connected to the ground potential through a filter circuit 6A at high frequencies, and connected to an A.C. bias power source 5A at low frequencies. In other words, the lower electrode 3 is an earth electrode when viewed from the high frequency power source (that is, RF power source) 5B, and the upper electrode 2 is an earth electrode when viewed from the bias power source 5A. The filter circuits 6A and 6B serve as blocking circuits for preventing the power sources 5A and 5B from interfering with each other. The frequency of the output voltage of the RF power source 5B is put in a range where the positive ion cannot follow the output voltage, that is, is made equal to, for example, 13.56 MHz, and the frequency of the output voltage of the A.C. bias power source 5A is put in a range where the positive ion can follow the output voltage, that is, is made equal to, for example, 400 KHz. When an RF voltage from the RF power source 5B is applied to the upper electrode 2, a plasma is generated. As shown in FIG. 2B, the plasma is kept at a positive potential by a positive ion, and a plasma potential $V_o$ is generated between the plasma and the lower electrode 3 which serves as the earth electrode. Further, when an A.C. voltage having a frequency of about 400 KHz is supplied from the bias power source 5A to the lower electrode 3, the positive ion is accelerated in accordance with the A.C. bias voltage. Thus, the energy of ions incident on the substrate 1 varies widely, and a large quantity of high-energy ions can be generated. As can be seen from the above, the plasma density is controlled mainly by the RF power source 5B, and the range of ion energy distribution can be enlarged by the A.C. bias power source 5A.

However, if the half width of the energy distribution curve C shown in FIG. 3 is enlarged by using the A.C. power source 5A, not only the number of ions having energy greater than $E_{th}(Si)$ but also the number of ions having energy greater than $E_{th}(SiO_2)$ will increase. That is, it is difficult to increase the etching rate for the poly-silicon layer while preventing the etching of the underlying silicon oxide layer.

In the present invention, it is intended to improve etching characteristics by controlling the range of ion energy distribution.

Figure 4A:
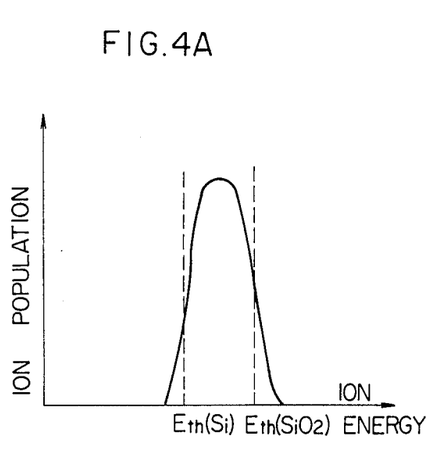
FIG. 4A is a distribution diagram showing a relationship between the ion energy and the number of active ions, which relationship is to be attained by an embodiment of the present invention.

FIG. 4A shows an example of the ion energy distribution according to the present invention. As shown in FIG. 4A, the energy of ions incident upon the substrate lies substantially in a range between $E_{th}(Si)$ and $E_{th}(SiO_2)$. Accordingly, the underlying silicon oxide layer is not etched, but only the poly-silicon layer on the underlying layer is etched. When the peak of the distribution curve is made higher, the etching rate for the poly-silicon layer is increased. That is, by making small the width of the ion energy distribution curve, the etching rate can be set to a desired value independently of the selectivity of etching.

Figure 4B:
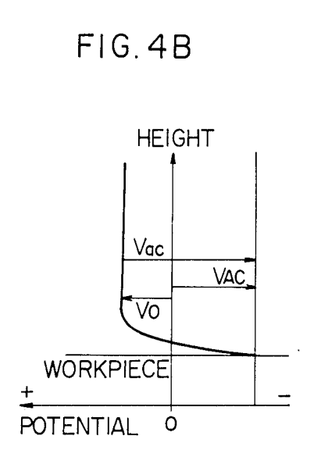
FIG. 4B is a diagram showing an example of the potential distribution required for realizing the ion energy distribution of FIG. 4A.

The ion energy distribution in such a narrow range can be realized by keeping substantially constant the potential difference between the plasma and a workpiece. FIG. 4B shows an example of the potential distribution in a processing chamber. When the potential difference $V_{ac}$ between the plasma and the surface of the workpiece (namely, the net ion accelerating voltage) is kept constant, the energy of ions incident on the workpiece is substantially constant, if energy variations due to the collision between particles are negligibly small.

Figure 5A:
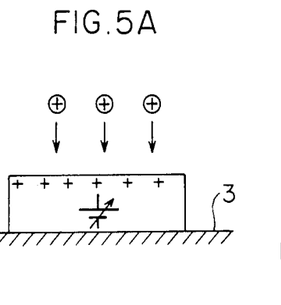
FIG. 5A is a schematic diagram showing electric charges which are accumulated on the surface of a workpiece in a plasma etching process.
Figure 5B:
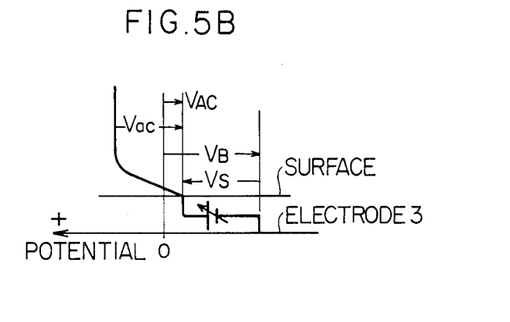
FIG. 5B is a diagram schematically showing the potential distribution around the workpiece.

Such a state can be realized by keeping the surface of the workpiece at desired negative potential $-V_{AC}$. (In many cases, $|V_{AC}| > |V_o|$ and $V_{ac} \approx V_{AC}$). In carrying out dry etching, however, an etching mask is often used which is made of an insulating or semi-insulating material. Further, an electrically floating layer such as the poly-silicon layer on the silicon oxide layer is often dry-etched. In these cases, the surface of the workpiece is not well connected electrically with the lower electrode 3. Accordingly, when positive ions are incident upon the surface of the workpiece, a positive charge is stored on the surface, and thus the surface of the workpiece is positively charged. That is, it can be considered that a voltage source $V_S$ whose output voltage increases with time, is connected between the electrode 3 applied with a bias voltage $V_B$ and the surface of workpiece, as shown in FIG. 5A. FIG. 5B shows the potential distribution in this state. As the positive charge is accumulated on the surface of the workpiece, the net ion accelerating voltage $V_{ac}$ decreases, and the energy of incident ion also decreases. Thus, desired ion energy distribution is not obtained, and the etching action is finally stopped.

The above problem can be solved by increasing the absolute value of the bias voltage $|V_B|$ in accordance with the magnitude of the voltage $|V_S|$ appearing across the workpiece, thereby cancelling an increase in voltage $|V_S|$. In this case, the net ion accelerating voltage $V_{ac}$ is kept constant, and thus an ion energy distribution curve can be formed in a narrow range around a desired energy value, as shown in FIG. 4A. However, it is actually impossible to increase the bias voltage $|V_B|$ to values exceeding a limit. Accordingly, when the magnitude of the bias voltage is increased to some degree, the surface of the workpiece is electrically neutralized. The surface charge due to the positive ions can be neutralized by a negative charge such as electrons. For achieving this, the bias voltage is changed to allow negatively charged particles to impinge upon the workpiece, for example the lower electrode 3 is to be kept at a positive potential. Here, it may be noted that the electron temperature is higher than the ion temperature, in low temperature plasma. Thus, electrons can flow into a target which is slightly negative. It is necessary here to change the electrode potential to a value which allows electrons to come in. Then, electrons will be incident on the surface, and the potential thereof reduces, and becomes equal to zero or to a certain position or negative value. In this state, the next bias-changing cycle is started. Thus, dry etching can be carried out at the same ion accelerating voltage.

Figure 6A:
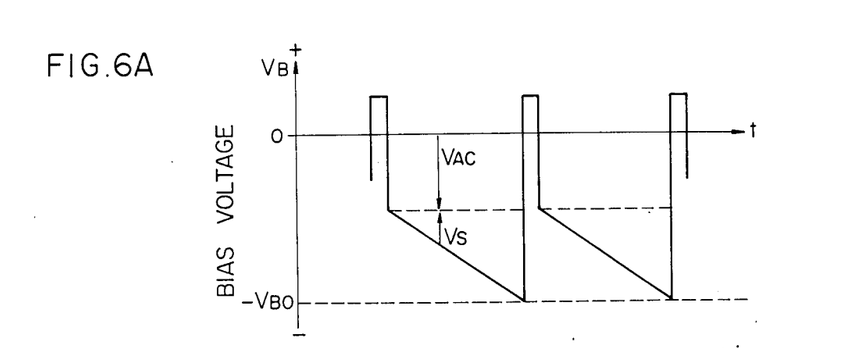
FIG. 6A is a diagram showing a voltage waveform which is applied to an electrode in an embodiment of a dry etching method according to the present invention.
Figure 6B:
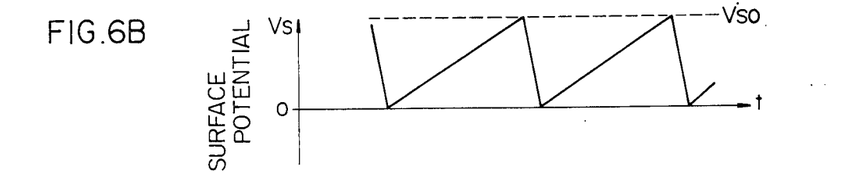
FIG. 6B is a diagram showing the charge in the surface potential of a workpiece during etching when the voltage of FIG. 6A is applied to the electrode.

FIGS. 6A and 6B show the waveforms of the bias voltage and the surface potential of the workpiece, respectively, by way of example. Since the plasma potential is constant, it does not concern the variation in the net accelerating voltage. Thus, the accelerating voltage with respect to the ground $V_{AC}$ may be used in place of $V_{ac}$. The potential $V_S$ of the surface of the workpiece with respect to the electrode 3 increases linearly with time on the basis of the accumulation of the positive ions, as shown in FIG. 6B. The bias voltage $V_B$ applied to the electrode 3 is changed in accordance with an increase in the surface potential $V_S$, as shown in FIG. 6A. That is, a voltage whose magnitude is equal to $|V_{AC}| + |V_S|$, is applied to the electrode 3, to maintain the surface of the workpiece at the constant potential $V_{AC}$. Since the magnitude $|V_S|$ of surface potential increases substantially linearly, the magnitude of bias voltage is increased linearly from the value $|V_{AC}|$, as indicated on the negative side of the waveform of FIG. 6A. Here, what is important is that the voltage waveform includes an accelerating voltage component $V_{AC}$ and a charge-up compensating component which cancels the effect of the change in the surface potential $V_S$ due to charge-up of the workpiece. The accelerating voltage component $V_{AC}$ may be allowed to vary to some extent according to the purposes of etching. In the case where the magnitude of bias voltage is to be kept less than $V_{BO}$, the bias voltage is changed to a positive value immediately after having reached the value $V_{BO}$. Thus, electrons are incident upon the surface of the workpiece, and the surface charge of the workpiece is reduced, that is, the magnitude $V_S$ of surface potential is decreased. Since the mass of the electron is far smaller than that of the positive ion, the electron is readily accelerated, and thus the neutralization of surface charge is rapidly carried out. Accordingly, an integrated value $|\int V_B dt|$ of bias voltage at that portion of the waveform of FIG. 6A which exists on the positive side, is far smaller than a similar integrated value $|\int V_B dt|$ at that portion of the above waveform which exists on the negative side. The surface potential $V_S$ is rapidly decreased by the abovementioned neutralization, as shown in FIG. 6B. After such neutralization, the bias voltage is returned to negative values, to allow the positive ion to impinge on the surface of the workpiece. In order to continue an etching operation for a desired period, it is necessary to make the final state of each bias-changing cycle equal to the initial state thereof. For example, it is preferred that the surface potential is increased from zero to $V_{SO}$ and then decreased to zero in each cycle or period, as shown in FIG. 6B. As stated before, the electron-accelerating voltage may not necessarily be positive. In particular, at the initial period of neutralization, the stored positive charge serves as a positive voltage source. Thus, the electrode potential at the neutralization step may also be negative or zero provided that electrons are allowed to impinge the workpiece.

In practice, the plasma potential $V_o$ lies in a range from several volts to 30 V, and the ion accelerating voltage $V_{AC}$ which does not includes the plasma potential or which is defined with respect to the ground potential is put in a range from about 50 V to about 1,000 V. In the case where a semiconductor layer is etched, it is preferred that the ion accelerating voltage lies in a range from about 50 V to about 800 V, and an ion accelerating voltage of about 50 to 300 V is specifically important. The repetition frequency of bias voltage $V_B$ is put in a range from about 1 KHz to about 200 KHz, preferably in a range from about 7 KHz to about 20 KHz. In the case where a semiconductor layer is etched, it is specifically preferable to use a repetition frequency of about 7 to 10 KHz.

Figure 7:
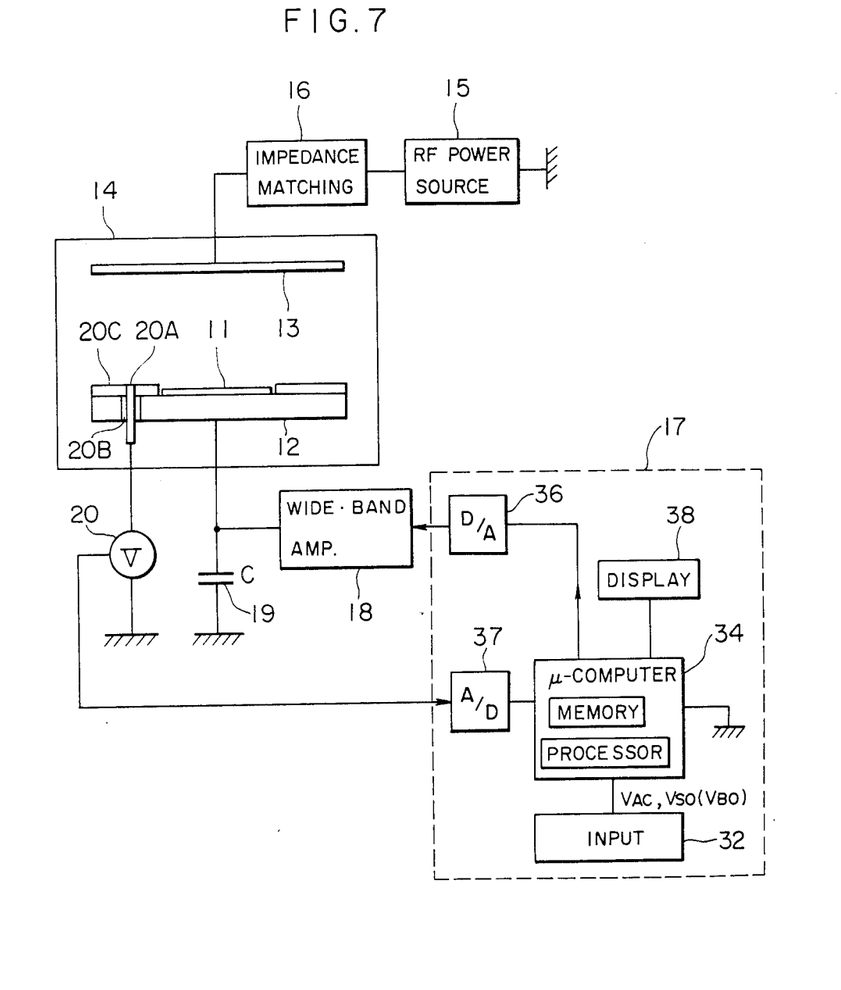
FIG. 7 is a block diagram showing an embodiment of a dry etching apparatus according to the present invention.

FIG. 7 shows, in block, an embodiment of a dry etching apparatus according to the present invention. In FIG. 7, reference numeral 11 designates a workpiece, that is, a substrate to be processed, 12 a lower electrode, 13 an upper electrode, 14 a processing chamber, 15 an RF power source, 16 an impedance matching circuit, 17 a control voltage generating unit, 18 a wideband power amplifier, 19 a capacitor for leading an RF component to the ground potential, 20 a voltmeter, 20A a potential measuring probe, 20B an insulating member, and 20C a quartz plate. The control voltage generating unit 17 includes an input device 32, a microcomputer 34 including a memory and a processor, a digital to analog converter (namely, D-A converter) 36, an analog to digital converter (namely, A-D converter) 37, and a display 38. The lower electrode 12 and the upper electrode 13 are disposed in the processing chamber 14. The upper electrode 13 is connected through the impedance matching circuit 16 to the RF power source 15, which generates an RF voltage having a frequency of for example 13.56 MHz. The lower electrode 12 is grounded through the capacitor 19, and is also connected to the wideband amplifier 18. The quartz plate 20C is placed on the lower electrode 12, and the to-be-processed substrate 11 is placed on a central portion of the electrode 12. Further, the potential measuring probe 20A is mounted in a portion of the electrode 12 through the insulating material, to measure the surface potential of the quartz plate 20C which is placed on the electrode 12. When the voltmeter 20 generates a digital output, the D/A converter 37 may be dispensed with. The output terminal of the voltmeter 20 is connected to the control voltage generating unit 17. Waveform parameters such as $V_{AC}$ and $V_{SO}$ (or $V_{BO}$) can be inputted to the above unit 17 by the input device 32. Although the waveform of the bias voltage is determined in accordance with the surface potential which is monitored by the probe 20A, as will be explained later, the above voltage waveform may also be determined on the basis of the waveform parameters which have been inputted by the input device 32, or by combining fundamental waveforms (such as sawtooth, square, sinusoidal) appropriately. Now, explanation will be made on the case where the waveform of the bias voltage is determined on the basis of the above monitoring operation.

The processing chamber 14 is evacuated and an etching gas is introduced into the processing chamber 14 through a gas feed pipe (not shown) so that the inside of the chamber 14 is kept at a working gas pressure of 10 to 0.05 Torr.

When the RF voltage from the RF power source 15 is applied to the upper electrode 13 in the above state, a plasma is generated between the lower electrode 12 and the upper electrode 13. Since the probe 20A is insulated from the lower electrode 12, the potential of a place equivalent to the surface of the substrate 11 is detected by the probe 20A and voltmeter 20. An accelerating voltage having a value which is preset by the control voltage generating unit 17, is applied to the lower electrode 12 through the wideband power amplifier 18. The positive ion which has been accelerated by the above voltage, impinges on the surface of the to-be-processed substrate 11, and thus the surface potential of the substrate 11 is increased. Accordingly, the potential difference between the plasma and the surface of the substrate 11 is equal to a difference between the voltage applied to the lower electrode 12 and the surface potential of the substrate 11. The surface potential is measured by the probe 20A, and the control voltage generating unit 17 changes the voltage applied to the electrode 12 more negatively, by an amount corresponding to an increase in surface potential, thereby providing a megative feed-back loop. In other words, the absolute value of the negative voltage applied to the lower electrode 12 is increased by a value corresponding to an increase in surface potential. When the above voltage is decreased to a value-$V_{BO}$, the potential of the lower electrode 12 is changed to a positive value as shown in FIG. 6A, to allow an electron to flow into the substrate 11 and lower electrode 12, thereby reducing the surface potential to zero volt. When a surface potential of zero volt is detected by the probe 20A, the voltage applied to the lower electrode 12 is returned to the preset value. Such an operation is repeated many times. Thus, the ion accelerating voltage is kept constant, and therefore the ion energy can be distributed only in a desired small range.

In the above case, in order to keep the ion accelerating voltage constant, the output of the control voltage generating unit 17 is controlled by a signal from the potential measuring probe 20A. However, in the case where processing conditions are previously determined, it is possible to determine the waveform of the voltage applied to the lower electrode 12, on the basis of the processing conditions, and to apply the waveform thus obtained to the electrode 12. In this case, the probe 20A and voltmeter 20 are not used, and therefore may be omitted.

Figure 8:
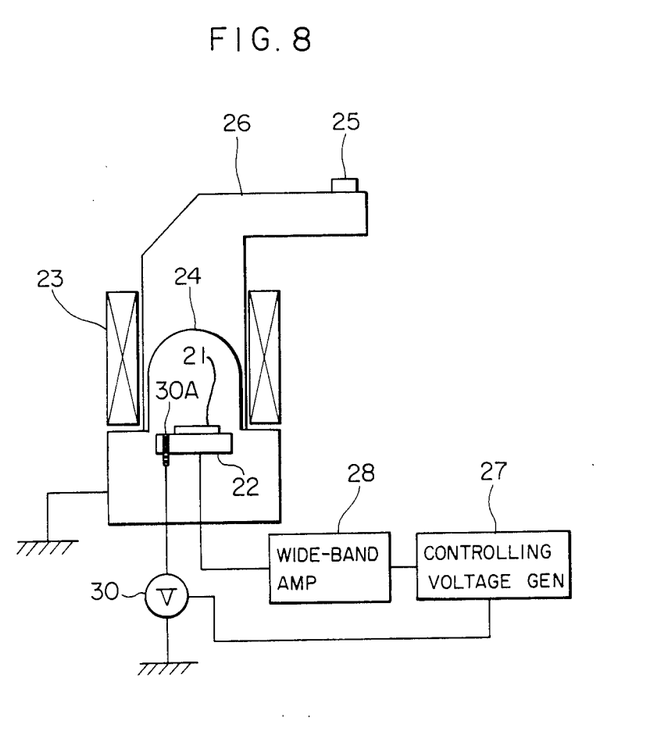
FIG. 8 is a block diagram showing another embodiment of a dry etching apparatus according to the present invention.

FIG. 8 shows another embodiment of a dry etching apparatus according to the present invention. In the present embodiment, a plasma for dry etching is generated utilizing the condition of the electron cyclotron resonance. In FIG. 8, reference numeral 21 designates a workpiece, that is, a substrate to be processed, 22 a control electrode, 23 a coil, 24 a processing chamber, 25 a magnetron, 26 a waveguide, 27 a control voltage generating unit, 28 a wideband power amplifier, 30 a voltmeter, and 30A a potential measuring probe.

The magnetron 25 is mounted on one end of the waveguide 26, the other end of which is connected to the processing chamber 24 through a quartz wall. The magnet coil 23 is disposed around the other end of the waveguide 26. The control electrode 22 provided with the probe 30A is disposed in a lower region of the processing chamber 24. The control electrode 22 is connected to the power amplifier 28, and the voltage applied to the control electrode 22 is controlled by the control voltage generating unit 27 and voltmeter 30 through the amplifier 28. The control voltage generating unit 27 has similar construction and function as the control voltage generating unit 17 of FIG. 7.

A plasma is generated on the conditions of the electron cyclotron resonance caused by a microwave which is generated by the magnetron 25, and a magnetic field which is formed by the coil 23. The ion accelerating voltage applied between the plasma and the to-be-processed substrate 21 is controlled in the same manner as in the embodiment of FIG. 7.

In a conventional dry etching apparatus of electron cyclotron resonance type, the positive ion in a plasma is drawn out by a grid electrode. However, owing to the presence of space charges and others, it has been difficult to control an ion accelerating voltage less than about 500 V. According to the present embodiment, the ion accelerating voltage applied between the plasma and the surface of the substrate 21 can be kept constant, and moreover can be set to a desired value. Further, in the present embodiment, it is not required to use the grid electrode which is usually made of a metal and exposed to the plasma, and therefore there is no fear of the processing chamber 24 being contaminated by the metal.

As is apparent from the above, the present invention is not limited to a dry etching apparatus in which a plasma is generated between parallel plate electrodes, but is also applicable to dry etching apparatuses in which a plasma is generated in other manners than the above.

In the above embodiments, means for maintaining an ion accelerating voltage substantially constant is provided independently of means for generating a plasma. However, means for producing a constant ion accelerating voltage may also be used commonly with the means for generating a plasma, if possible.

As has been explained in the foregoing, the present invention can greatly improve etching characteristics of dry etching, thereby increasing the production yield of a semiconductor wafer or the like, and making it possible to etch a fine pattern accurately.

I claim:

1. A dry etching method comprising the steps of:
placing a workpiece on an electrode, said electrode being disposed in a processing chamber;
introducing an etching gas into said processing chamber;
exciting said etching gas to generate a plasma; and
applying a periodical voltage waveform V to said electrode, said periodical voltage waveform V having a first portion for allowing electrons to impinge the workpiece and a second portion for accelerating positive ions toward the workpiece, said second portion of the waveform including a first component for generating a substantially constant accelerating field and a second component for cancelling the effect of increasing charge-up at the workpiece surface, whereby positive ions are accelerated to substantially constant ion energy independently of the increasing charge up at the workpiece surface.

2. A dry etching method comprising the steps of:
placing a workpiece on an electrode, said electrode being disposed in a processing chamber;
introducing an etching gas into said processing chamber;
exciting said etching gas to generate a plasma; and
applying a periodical voltage waveform V to said electrode, said periodical voltage waveform V having, in each period, a first portion of a first polarity and a second portion of a second polarity, the first portion having a substantially constant first voltage-time product $S_1 = V(t)dt$ the second portion having a second voltage-time product $S_2 = V(t)dt$ which is greater than said first product $S_1$, the time derivative of the voltage at said portion being non-zero and substantially constant, whereby particles of said first polarity in said plasma impinge on a surface of said workpiece in a length of time corresponding to said second portion of said voltage waveform, the magnitude of the voltage applied to said electrode in said length of time being increased with an increase in electric charge at said surface of said workpiece, to subject said particles to a substantially constant accelerating voltage, and said electric charge at said surface of said workpiece being neutralized by particles of said second polarity in a length of time corresponding to said first portion of said voltage waveform.

3. A dry etching method according to claim 2, wherein the magnitude of the voltage at said second portion of said periodical voltage waveform is not less than a first predetermined value.

4. A dry etching method according to claim 3, wherein the magnitude of the voltage at said second portion of said periodical voltage waveform is not greater than a second predetermined value.

5. A dry etching method according to claim 2, further comprising a step of setting first and second values for indicating lower and upper limits of the magnitude of the voltage at said second portion of said periodical voltage waveform, respectively.

6. A dry etching method according to claim 5, further comprising a step of measuring the potential at a place equivalent to said surface of said workpiece placed on said electrode, and a step of determining a voltage for said second portion of said voltage waveform on the basis of the measured potential for producing a substantially constant potential at said surface of said workpiece.

7. A dry etching method according to claim 6, further comprising a step of detecting a time when the magnitude of said measured potential is reduced to zero, when said first portion of said voltage waveform has been applied, and a step of detecting a time when the magnitude of said measured potential reaches a value corresponding to said second value, when said second portion of said voltage waveform has been applied.

8. A dry etching method according to claim 2, further comprising a step of determining and inputting said periodical voltage waveform by an input device.

9. A dry etching apparatus comprising:
an evacuatable processing chamber;
an electrode disposed in said processing chamber and applied with a voltage, said electrode being arranged for receiving a workpiece thereon;
gas feed means for introducing an etching gas into said processing chamber;
plasma generating means for exciting said etching gas to generate a plasma in said processing chamber; and
means for generating a periodic voltage waveform and applying the waveform to said electrode, the waveform having a first portion for allowing electrons to impinge the workpiece surface and a second portion for accelerating positive particles toward the workpiece, said second portion of the waveform including a first component for generating a substantially constant accelerating field and a second component superposed on the first component for cancelling the effect of increasing charge-up at the workpiece surface, whereby ions are accelerated to substantially constant ion energy independently of the increasing charge-up at the workpiece surface.

10. A dry etching apparatus comprising:
an evacuatable processing chamber;
an electrode disposed in said processing chamber for applying a voltage and for accommodating a workpiece thereon;
gas feed means for introducing an etching gas into said processing chamber;
plasma generating means for exciting said etching gas to generate a plasma; and means for generating a periodical voltage waveform applied to said electrode, said periodical voltage waveform having, in each period, a first portion of a first polarity and a second portion of a second polarity, a first substantially constant voltage-time product $S_1 = V(t)dt$ being obtained at said first portion, a second voltage-time product $S_2 = V(t)dt$ obtained at said second portion being greater than said first product, the derivative of the voltage at said second portion with respect to time being non-zero and substantially constant, wherein particles of said first polarity said plasma impinge on a surface of said workpiece in a length of time corresponding to said second portion of said voltage waveform, the magnitude of the voltage applied to said electrode in said length of time being increased with an increase in electric charge at said surface, to subject said particles to a substantially constant accelerating voltage, and said electric charge at said surface being neutralized by particles of said second polarity in a length of time corresponding to said first portion of said voltage waveform.

11. A dry etching apparatus according to claim 10, wherein the magnitude of the voltage at said second portion of said periodical voltage waveform is not less than a first predetermined value.

12. A dry etching apparatus according to claim 10, wherein said voltage waveform generating means includes an input device for inputting various waveform parameters.

13. A dry etching apparatus according to claim 12, wherein said voltage waveform generating means further includes memory means, an arithmetic and logic unit, and output means for forming an output signal indicative of said voltage waveform.

14. A dry etching apparatus according to claim 10, further comprising means for measuring a potential at a place in said processing chamber which is equivalent to said surface of said workpiece.

15. A dry etching apparatus according to claim 14, wherein the result of the measurement made by said potential measuring means is supplied to said voltage waveform generating means, to control said periodical voltage waveform, said measuring means and said voltage waveform generating means forming a negative feed-back loop.

16. A method for dry-etching a workpiece placed in a reaction vessel by introducing a processing gas in the reaction vessel to a predetermined pressure, and exciting said gas to generate a plasma to process said workpiece while applying a bias voltage to the workpiece, comprising the steps of:

detecting the potential of said workpiece; and applying an AC voltage to said workpiece which compensates variations in the detected potential of said workpiece so as to leave only a DC component.

17. A method according to claim 16, including forming a negative feed-back loop for detecting the potential of said workpiece and applying the AC voltage to said workpiece.

18. A dry-etching apparatus comprising:

a reaction vessel;

means for introducing a processing gas into the reactor vessel and maintaining the pressure of said gas at a predetermined level;

means for exciting the gas to generate a plasma;

electric power source means for applying an AC voltage to a workpiece in the reaction vessel which compensates for variations in the potential of said workpiece so as to leave only a DC component;

means for detecting the voltage of said workpiece; and control voltage source means for inputting a signal from said detecting means and supplying a control signal to said electric power source means so as to provide a negative feed-back loop.

* * * * *